(12) United States Patent
Oishi et al.

(10) Patent No.: US 9,467,090 B2
(45) Date of Patent: *Oct. 11, 2016

(54) SEMICONDUCTOR DEVICE

(71) Applicant: RENESAS ELECTRONICS CORPORATION, Kanagawa (JP)

(72) Inventors: Tsukasa Oishi, Kanagawa (JP); Katsuyoshi Mitsui, Kanagawa (JP); Naoki Otani, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,052

(22) Filed: Jan. 9, 2015

(65) Prior Publication Data

US 2015/0116041 A1  Apr. 30, 2015

Related U.S. Application Data

(63) Continuation of application No. 13/571,114, filed on Aug. 9, 2012, now Pat. No. 8,963,650, which is a continuation of application No. 13/021,047, filed on Feb. 4, 2011, now Pat. No. 8,264,294.

(30) Foreign Application Priority Data

Feb. 8, 2010 (JP) .................. 2010-025698

(51) Int. Cl.
*H03B 5/04* (2006.01)
*H03L 1/00* (2006.01)
*H03L 1/02* (2006.01)

(52) U.S. Cl.
CPC . *H03B 5/04* (2013.01); *H03L 1/00* (2013.01); *H03L 1/026* (2013.01)

(58) Field of Classification Search
CPC .................. H03B 5/04; H03L 1/00

USPC ............................ 331/34, 176, 66
See application file for complete search history.

(56) References Cited

U.S. PATENT DOCUMENTS

| | | | |
|---|---|---|---|
| 5,070,311 A | 12/1991 | Nicolai | |
| 7,371,005 B1 | 5/2008 | Ahuja et al. | |
| 7,583,154 B1 | 9/2009 | Kizziar | |
| 7,714,674 B2 | 5/2010 | Guo et al. | |
| 8,264,294 B2 * | 9/2012 | Oishi | ........................ H03L 1/00 331/16 |
| 2007/0133319 A1 | 6/2007 | Noichi | |
| 2007/0164832 A1 | 7/2007 | Matsuoka et al. | |
| 2013/0222022 A1 | 8/2013 | Vyas | |

FOREIGN PATENT DOCUMENTS

| | | |
|---|---|---|
| JP | 2001-044759 A | 2/2001 |
| JP | 2003-084859 A | 3/2003 |
| JP | 2003-258551 A | 9/2003 |
| JP | 2007-067675 A | 3/2007 |
| JP | 2007-164865 A | 6/2007 |
| JP | 2007-194711 A | 8/2007 |

\* cited by examiner

*Primary Examiner* — Joseph Chang
(74) *Attorney, Agent, or Firm* — McDermott Will & Emery LLP

(57) ABSTRACT

A semiconductor device contrived to prevent a reference voltage and a reference current which are supplied to a high speed OCO from varying with a change in ambient temperature and/or a change in an external power supply voltage and to reduce the circuit area of a power supply module. The high speed OCO outputs a high speed clock whose magnitude is determined by the reference current and the reference voltage. A logic unit adjusts the values of the reference current and reference voltage, according to the reference voltage and reference current trimming codes related to detected ambient temperature and operating voltage.

9 Claims, 8 Drawing Sheets

FIG. 2A

| TEMPERATURE | TEMPERATURE CODE |
|---|---|
| -45 TO 20 | 00 |
| 20 TO 90 | 01 |
| 90 TO 150 | 10 |

FIG. 2B

| VOLTAGE | VOLTAGE CODE |
|---|---|
| 1.8 TO 3.6 | 0 |
| 3.6 TO 5.5 | 1 |

FIG. 3

| TEMPERATURE CODE | VOLTAGE CODE | TRIMCODE1 [2:0] | TRIMCODE2 [4:0] | TRIMCODE3 [7:0] |
|---|---|---|---|---|
| 00 | 0 | ... | ..... | ....... |
| 00 | 1 | ... | ..... | ....... |
| 01 | 0 | ... | ..... | ....... |
| 01 | 1 | ... | ..... | ....... |
| 10 | 0 | ... | ..... | ....... |
| 10 | 1 | ... | ..... | ....... |

SEMICONDUCTOR DEVICE

CROSS-REFERENCE TO RELATED APPLICATIONS

This application is a continuation of U.S. application Ser. No. 13/571,114, filed on Aug. 9, 2012, which is a continuation of U.S. application Ser. No. 13/021,047, filed on Feb. 4, 2011, now U.S. Pat. No. 8,264,294, which claims priority of Japanese Patent Application No. 2010-025698 filed on Feb. 8, 2010, the contents of which are incorporated herein by reference in their entirety.

BACKGROUND OF THE INVENTION

The present invention relates to a semiconductor device and, in particular, relates to a semiconductor including on-chip oscillators.

It is known that the oscillation frequency of an on-chip oscillator serving as a clock signal source in a microcomputer varies with a change in ambient temperature and/or a change in an external power supply voltage.

Although compensating such a variation in the oscillation frequency is performed during a test in a process stage, this compensation is difficult to carry out under all voltage conditions and temperature conditions during a test in the process stage. Moreover, the oscillation frequency changes under the influence of various factors that cannot be foreseen in a test in the process stage. These factors involve a junction leak in a high temperature domain, a rapid rise above threshold in a low temperature domain, a transistor breakdown phenomenon in a high voltage domain, an influence of triode-like operation of transistors in a low voltage domain, etc.

For the above reasons, techniques for compensating a variation in the oscillation frequency due to a temperature change during actual operation are disclosed in patent documents 1 to 4.

For example, patent document 1 discloses the following technique. When CPU 40 is supplied with temperature information from a temperature detector circuit 50, CPU 40 reads control voltage information suitable for the temperature from a storage circuit 60 and supplies this information to a control voltage generator circuit 30. Then, the control voltage generator circuit 30 generates a control voltage based on the control voltage information and a reference clock generator 20 generates a primary reference clock having a desired frequency based on the control voltage. Thereby, it is possible to efficiently acquire a control voltage suitable for ambient temperature at device power-on and to decrease a frequency error attributed to a temperature characteristic of the primary reference clock at device power-on.

Patent document 2 discloses the following technique. A temperature compensated oscillation circuit 10 comprises an oscillator circuit 42 with a piezoelectric vibrator 40; a temperature measuring unit 22 which measures the temperature of the piezoelectric vibrator 40 intermittently and outputs a digital signal corresponding to the measurement result; a counter 28 which takes input of upper bits of the digital signal output from the temperature measuring unit 22, sets the upper bits depending on a least significant bit of the digital signal, and outputs these bits as an address value; a storage unit 30 in which offset values for on/off control of switches provided in capacitor arrays 44 and address values are stored in one-to-one correspondence, wherein an offset value related to an address value which has been input from the counter 28 is read and output from the storage unit 30; and two capacitor arrays 44 provided in the oscillator circuit 42, wherein the capacitance value of each capacitor array is set according to an offset value which has been input from the storage unit 30.

Patent document 3 discloses the following technique. A compensation interval determining circuit 12 evaluates a temperature change based on a detected temperature from a temperature sensor 16 and determines a compensation interval for compensating the oscillation frequency of an oscillator circuit 7 according to the temperature change. A clock signal with a frequency suitable for this compensation interval is selected by a selector circuit 14 and supplied to a compensation control circuit 15. Based on the clock signal, a temperature to digital signal converter circuit 17 converts the temperature detected by the temperature sensor 16 into a digital signal of temperature data. An offset value determining circuit 18 reads an offset value related to the temperature data and the offset value is set in an offset register 19. According to the offset value contained in the offset register 6, switches S1 to Sn are turned on/off and the capacitances of capacitors C1 to Cn are changed in the oscillator circuit 7.

Patent document 4 discloses the following technique. Oscillation cycle data which varies depending on temperature is stored in an EEPROM of a microcomputer and CPU reads data stored in the EEPROM according to a temperature detected by a temperature detector circuit (steps S2, S3). By setting a determined multiplier value in a DPLL circuit (step S4, S5), the oscillation frequency of a multiplied clock signal is compensated.

Furthermore, techniques for compensating a variation in the oscillation frequency due to a change in an external power supply voltage during actual operation are disclosed in patent documents 5 and 6.

Patent document 5 discloses the following technique. An integrated circuit comprising a processor (CPU) and an oscillator (OSC) integrated in a same substrate is provided. The integrated circuit further comprises a data register (R1) into which data can be loaded by the processor. The oscillator functions as a clock source for the processor and the oscillator comprises a capacitor (C) and a current source for charging and discharging the capacitor. By controlling a value of a current for charging and discharging the capacitor, the data register controls an adjustment of the oscillator frequency. The data register is provided in the same substrate of the integrated circuit and data is loaded into it by the processor from an electrically programmable nonvolatile memory (M1) storing frequency correction data.

Patent document 6 discloses the following technique. Within a chip, trimming values are calculated and stored into a nonvolatile memory and trimming data is retrieved, when required, and used to adjust the Vt level of a reference cell and the frequency of an oscillator. Since chip-specific random trimming can be carried out within a chip, control on a per-chip basis is no longer required, even in a case where a plurality of chips are measured by an external device at the same time. Therefore, it is possible to reduce a testing time and man-hours for developing a test program and it is also decrease human errors induced by complicated test programs.

PRIOR ART DOCUMENTS

Patent Documents

[Patent Document 1]
Japanese Unexamined Patent Publication No. 2001-44759
[Patent Document 2]
Japanese Unexamined Patent Publication No. 2007-67675

[Patent Document 3]
Japanese Unexamined Patent Publication No. 2003-258551
[Patent Document 4]
Japanese Unexamined Patent Publication No. 2007-194711
[Patent Document 5]
Japanese Unexamined Patent Publication No. 2003-84859
[Patent Document 6]
Japanese Unexamined Patent Publication No. 2007-164865

SUMMARY OF THE INVENTION

By the way, within a microcomputer, a power supply module is needed which generates a reference voltage and a reference current which are supplied to an oscillator to allow the oscillator to output a clock with a fixed frequency. In order to prevent a variation in the oscillation frequency of the oscillator with a high accuracy, a power supply module is required which generates a reference voltage and a reference current which do not vary, even if the ambient temperature changes and/or the external power supply voltage changes. However, this poses a problem of increasing the circuit area of the microcomputer. In the cited documents 1 to 6, there are no descriptions as to generating a reference voltage and a reference current which do not vary, even if the ambient temperature changes and/or the external power supply voltage changes, and as to measures for alleviating the resulting increase in the circuit area.

It is therefore an object of the present invention to provide a semiconductor device contrived to enable preventing a reference voltage and a reference current which are supplied to an on-chip oscillator from varying with a change in ambient temperature and/or a change in an external power supply voltage and to reduce the circuit area of a power supply module.

According to one embodiment of the present invention, there is provided a semiconductor device comprising: a first on-chip oscillator which receives a reference current and a reference voltage and outputs a clock signal with a first frequency whose magnitude is determined by the reference current and the reference voltage; a temperature sensor which detects an ambient temperature of the first on-chip oscillator; a voltage sensor which detects a value of an operating voltage of the first on-chip oscillator; a power supply module which includes a reference circuit for generating a primary reference voltage and generates the reference voltage, the reference current, and the operating voltage of the first on-chip oscillator, based on the primary reference voltage which is output by the reference circuit; a storage unit which stores a table specifying trimming codes for the reference voltage and the reference current, related to an ambient temperature of the first on-chip oscillator and an operating voltage of the first on-chip oscillator; and a logic unit which reads reference voltage and reference current trimming codes related to the detected ambient temperature and operating voltage and adjusts the values of the reference current and the reference voltage, according to the read trimming codes.

According to this embodiment, it is possible to prevent the oscillation frequency from varying with a change in the ambient temperature and/or a change in the external power supply voltage and to reduce the circuit area of the power supply module.

BRIEF DESCRIPTION OF THE DRAWINGS

FIG. 2(a) shows exemplary temperature codes.

FIG. 2(b) shows exemplary voltage codes.

FIG. 3 is illustrative of exemplary trimming codes.

DETAILED DESCRIPTION OF PREFERRED EMBODIMENT

Figure 1:
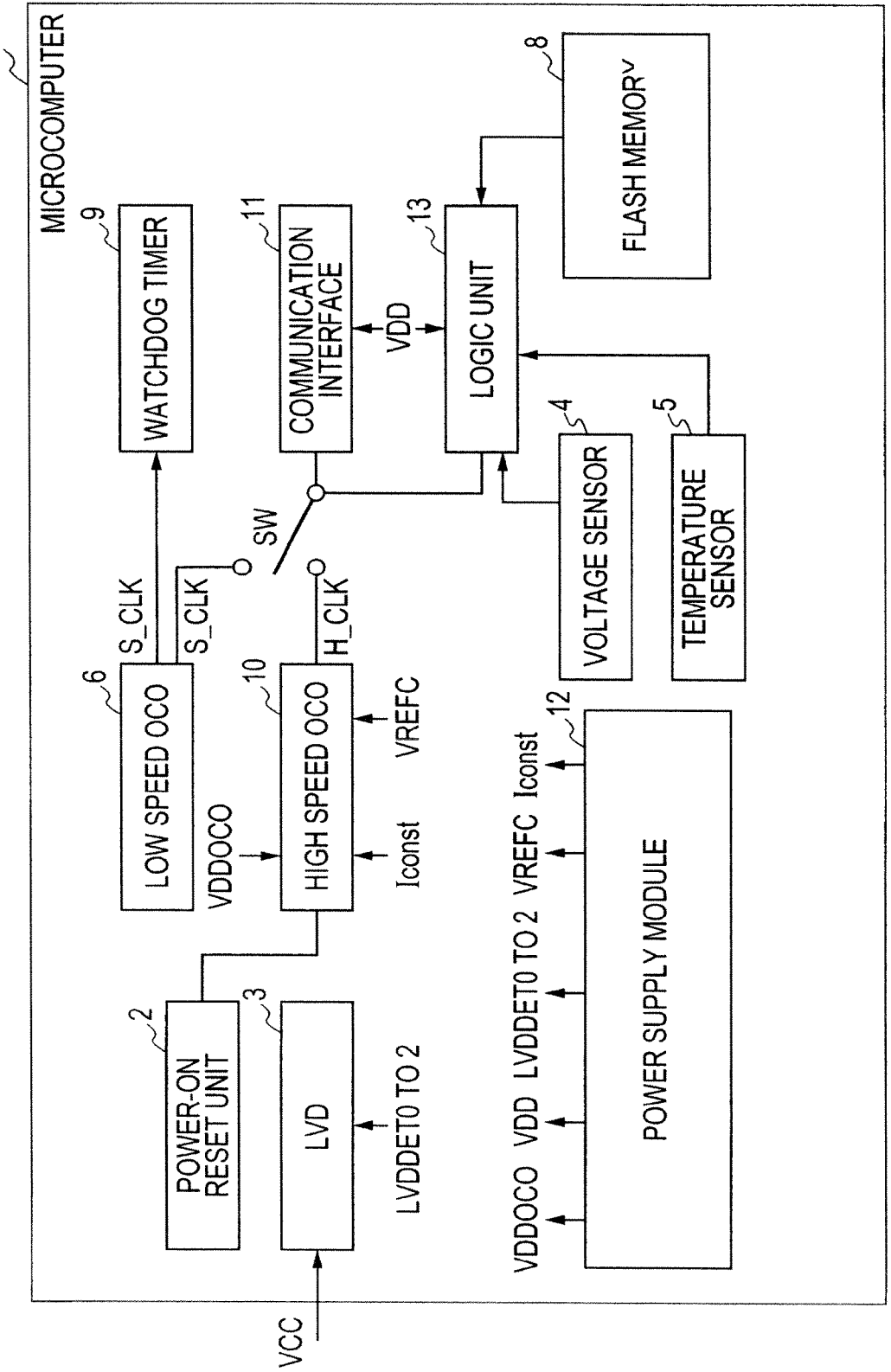
FIG. 1 is a diagram showing a microcomputer configuration of an embodiment of the present invention.

In the following, an exemplary embodiment of the present invention will be described with reference to the drawings.
[Microcomputer Configuration] FIG. 1 is a diagram showing a microcomputer configuration of an embodiment of the present invention.

Referring to FIG. 1, the microcomputer (semiconductor device) 1 comprises a power-on reset unit 2, a low voltage detector (LVD) 3, a voltage sensor 4, a temperature sensor 5, a flash memory 8, a logic unit 13, a low speed OCO (On-chip oscillator) 6, a high speed OCO 10, a switch SW, a watchdog timer 9, a communication interface 11, and a power supply module 12.

The low speed OCO 6 outputs a low speed clock S_CLK. The high speed OCO 10 outputs a high speed clock H_CLK.

The temperature sensor 5 detects the ambient temperature of the high speed OCO 10 and outputs a 2-bit temperature code.

FIG. 2(a) shows exemplary temperature codes. Referring to FIG. 2(a), the temperature sensor 5 outputs a temperature code "00" upon detecting a temperature of −45° C. or above, but less than 20° C. The temperature sensor 5 outputs a temperature code "01" upon detecting a temperature of −20° C. or above, but less than 90° C. The temperature sensor 5 outputs a temperature code "10" upon detecting a temperature of 90° C. or above, but less than 150° C.

The voltage sensor 4 detects a value of an operating voltage VDDOCO for the high speed OCO and outputs a 1-bit voltage code.

FIG. 2 (b) shows exemplary voltage codes. Referring to FIG. 2(b), the voltage sensor 4 outputs a voltage code "0" upon detecting a voltage VDDOCO of 1.8 V or above, but less than 3.6 V. The voltage sensor 4 outputs a voltage code "1" upon detecting a voltage VDDOCO of 3.6 V or above, but less than 5.5 V.

The flash memory 8 stores a trimming table specifying three trimming codes in relationship to a temperature code and a voltage code.

FIG. 3 is illustrative of exemplary trimming codes. TRIMCODE1[2:0] is a 3-bit trimming code. TRIMCODE2 [4:0] is a 5-bit trimming code. TRIMCODE3 [7:0] is an 8-bit trimming code. These trimming codes are intended to maintain a constant reference current and a constant reference voltage to be supplied to the high speed OCO 10 and thus to maintain a constant oscillation frequency of the high speed clock H_CLK.

The logic unit 13 reads, from the trimming table in the flash memory 8, trimming codes related to a temperature code which is output from the temperature sensor 5 and a voltage code which is output from the voltage sensor 4. According to the read trimming codes, the logic unit 13 adjusts the reference current and the reference voltage which are generated by the power supply module 12 and supplied to the high speed OCO 10. The logic unit 13 is implemented in a CPU (Central Processing Unit)

Figure 4A:
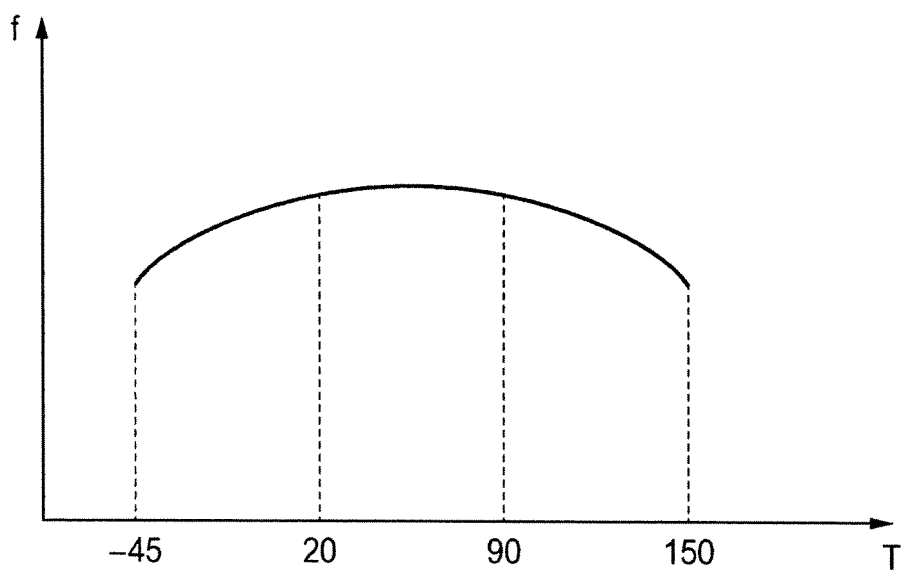
FIG. 4(a) is a graph exemplarily showing a change in the frequency of a high speed clock H_CLK which is output by a high speed OCO 10 depending on temperature change, when no adjustment is made by trimming code.

FIG. 4(a) is a graph exemplarily showing a change in the frequency of the high speed clock H_CLK which is output by the high speed OCO 10 depending on temperature change, when no adjustment is made by trimming code.

As can be seen in FIG. 4(a), the frequency of the high speed clock H_CLK changes, as temperature changes.

Figure 4B:
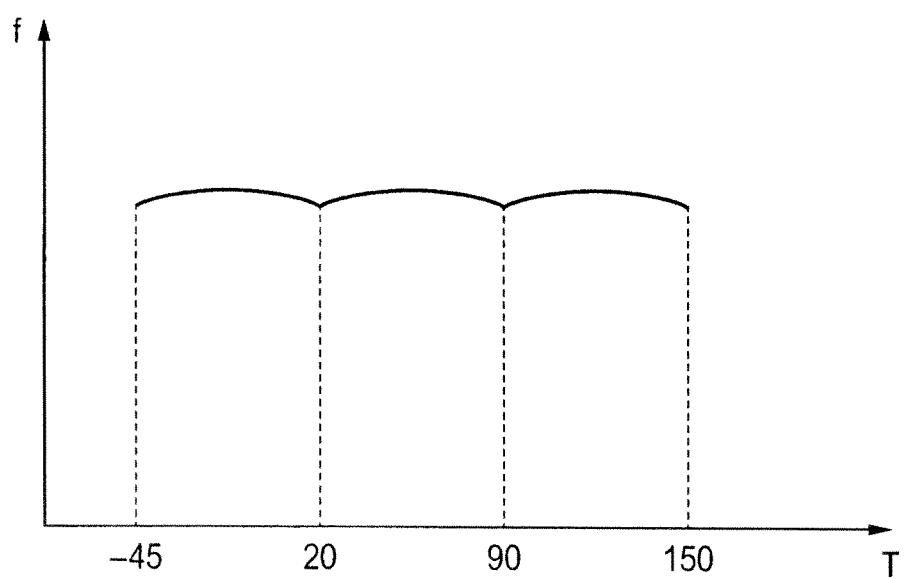
FIG. 4(b) is a graph exemplarily showing a change in the frequency of the high speed clock H_CLK depending on temperature change, after a reference current and a reference voltage are adjusted by trimming code.

FIG. 4(b) is a graph exemplarily showing a change in the frequency of the high speed clock H_CLK depending on temperature change, after the reference current and the reference voltage are adjusted by trimming code.

As can be seen in FIG. 4(b), the high speed clock H_CLK is kept virtually constant even if temperature changes.

The switch SW may be coupled to either the low speed OCO 6 or the high speed OCO 10 and makes a changeover of a clock to be provided to the logic unit 13 and the communication interface 11 between the low speed clock S_CLK which is output from the low speed OCO and the high speed clock H_CLK which is output from the high speed OCO 10.

The watchdog timer 9 is intended to detect an abnormal operation or runaway of the microcomputer. The watchdog timer 9 operates with the low speed clock S_CLK from the low speed OCO 6, because it does not need to be engaged in high speed processing.

The communication interface 11 outputs a signal to control a device which cooperates as a slave. The logic unit 13 and the communication interface 11 operate with the high speed clock H_CLK which is output from the high speed OCO 10, because they need to be engaged in high speed processing.

The LVD 3 detects a value of a voltage VCC which is supplied externally by comparison with decision voltages LVDDET0 to LVDDET2.

The power supply module 12 generates a voltage VDDOCO for operating the high speed OCO 10, a reference voltage VREFC and a reference current Iconst which are supplied to the high speed OCO 10, a voltage VDD for operating the logic unit 13 and the communication interface 11, and voltages LVDDET0, LVDDET1, LVDDET2 for decision to be made in the LVD 3.

The power-on reset unit 2 detects that the voltage VDDOCO for operating the high speed OCO 10 has risen.

[Power Supply Module and High Speed OCO Configurations]

Figure 5:
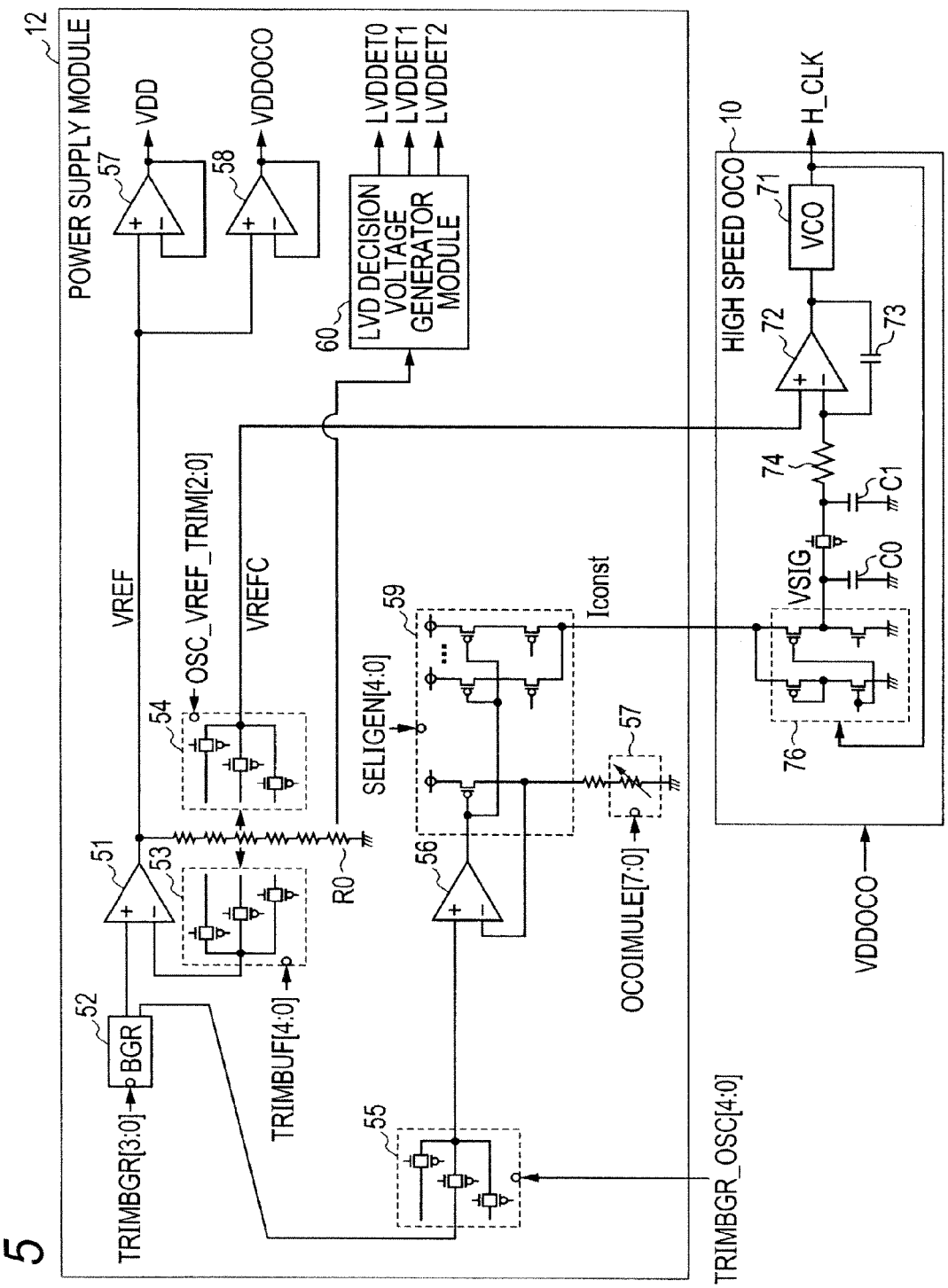
FIG. 5 is a diagram showing the configurations of a power supply module and a high speed OCO.

FIG. 5 is a diagram showing the configurations of the power supply module and high speed OCO.

Referring to FIG. 5, a band gap reference (BGR) generates a primary reference voltage by means of band gap. The BGR 52 includes a TRIMBGR[3:0] pin that receives a 4-bit signal for adjusting the output of the BGR 52. This adjustment is performed during a test in a process stage.

A primary reference voltage VREF is generated through an amplifier 51, an adjustment circuit 53, and a variable resistor R0. The amplifier 51 receives the primary reference voltage output from the BGR 52. The adjustment circuit 53 includes a TRIMBUF[4:0] pin that receives a 5-bit signal for adjusting the couplings between a plurality of MOS transistors and the variable resistor R0 and thus adjusting the value of the reference voltage VREF which is output from the amplifier 51 to a constant value (for example, 1.5 V). This adjustment is performed during a test in a process stage.

A reference voltage VREFC which is supplied to the high speed OCO 10 is generated through the variable resistor R0 and an adjustment circuit 54. The adjustment circuit 54 includes an OSC_VREF_TRIM[2:0] pin that receives a 3-bit signal TRIMCODE1 [2:0] for adjusting the couplings between a plurality of MOS transistors and the variable resistor R0 and thus adjusting the value of the reference voltage VREFC to a constant value (for example, 1.0V). TRIMCODE1[2:0] is supplied from the logic unit 13 during actual operation in order to adjust a variation in voltage and/or temperature.

An adjustment circuit 55 includes a TRIMBGR_OSC[4:0] pin that receives a 5-bit signal for adjusting the magnitude of a signal output from the BGR 52. This adjustment is performed during a test in a process stage.

A reference current Iconst which is supplied to the high speed OCO 10 is generated through an amplifier 56, an adjustment circuit 59, a variable resistor 57, and an adjustment circuit 59. The variable resistor 57 includes an OCOIMULE[7:0] pin that receives an 8-bit signal TRIMCODE3[7:0] for making a minute adjustment of the value of the reference current Iconst. TRIMCODE3[7:0] is supplied from the logic unit 13 during actual operation in order to adjust a variation in voltage and/or temperature. The adjustment circuit 59 includes a current mirror circuit and a SELIGEN[4:0] pin that receives a 5-bit signal TRIMCODE2 [4:0] for making a rough adjustment of the value of the reference current Iconst. TRIMCODE2[4:0] is supplied from the logic unit 13 during actual operation in order to adjust a variation in voltage and/or temperature.

An amplifier 57 generates a voltage VDD for operating the logic unit 13 and the communication interface 11, based on the primary reference voltage VREF.

An amplifier 58 generates a voltage VDDOCO for operating the high speed OCO 10, based on the primary reference voltage VREF.

An LVD decision voltage generator module 60 generates voltages LVDDET0, LVDDET1, LVDDET2 for decision to be made in the LVD 3, based on the primary reference voltage VREF.

The high speed OCO 10 includes a switching circuit 76, capacitors C0, C1, a resistor 74, a comparator 72, a capacitor 73, and a voltage controlled oscillator (VCO) 71.

The VCO 71 is an oscillator that controls the oscillation frequency of the high speed clock H_CLK by a voltage (control voltage).

The reference current Iconst is transmitted to a capacitance node VSIG to charge a capacitor C0.

The switching circuit 76 allows the reference current Iconst to be input to the capacitance node VSIG, when the high speed clock H_CLK is at "H" level.

When the potential of the capacitance node VSIG has reached the reference voltage VREFC, charging of the capacitor C0 is stopped by the comparator 72, VCO 71, and switching circuit 76. Thereby, the frequency of the high speed clock H_CLK is set to a value as a function of the amplitudes of the reference current Iconst and the reference voltage VREFC.

[Temperature Dependency]

Then, descriptions are provided for the temperature dependency of the oscillation frequency of the high speed clock H_CLK.

FIG. 6 (a) is a graph showing the temperature dependency of the capacitance of the capacitor C0. As shown in FIG. 6(a), the capacitance of the capacitor C0 changes depending on temperature. The percentage of its change falls within ±0.27%.

Figure 6A:
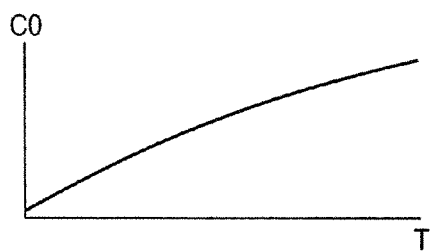
FIG. 6(a) is a graph showing the temperature dependency of a capacitor C0.
Figure 6B:
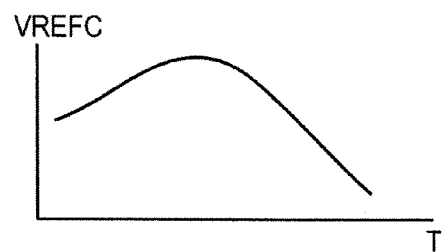
FIG. 6(b) is a graph showing the temperature dependency of a reference voltage VREFC.
Figure 6C:
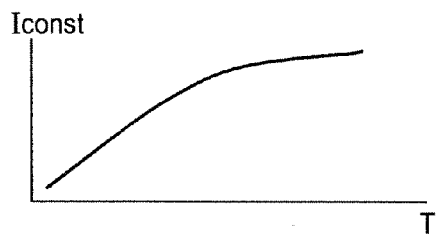
FIG. 6(c) is a graph showing the temperature dependency of a reference current Iconst.

FIG. 6(b) is a graph showing the temperature dependency of the reference voltage VREFC. As shown in FIG. 6 (b), the reference voltage VREFC changes depending on temperature. The percentage of its change falls within ±0.34%.

FIG. 6 (c) is a graph showing the temperature dependency of the reference current Iconst. As shown in FIG. 6(c), the reference current Iconst changes depending on temperature. The percentage of its change falls within ±2.20%.

FIG. 6 (d) is a graph showing the temperature dependency of the oscillation frequency F of the high speed clock H_CLK.

Figure 6D:
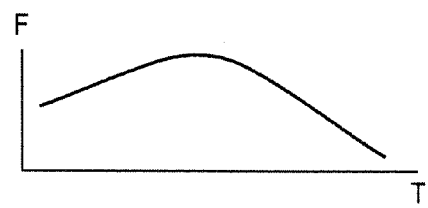
FIG. 6(d) is a graph showing the temperature dependency of the oscillation frequency F of the high speed clock H_CLK.

As shown in FIG. 6(d), changes depending on temperature. The percentage of its change falls within ±0.45%. The variation in the oscillation frequency F of the high speed clock H_CLK is smaller than the variation in the reference current Iconst, since the variation in the reference current Iconst depending on temperature is offset by the variations in the capacitance of the capacitor C0 and the reference voltage VREFC, which is expressed by the following relation: $F=Iconst/(C0 \times VREFC)$.

The variation in the oscillation frequency F of the high speed clock H_CLK is further reduced by adjusting the values of the reference current Iconst and the reference voltage VREFC using trimming codes.

[Stabilization of VDDOCO]

Figure 7:
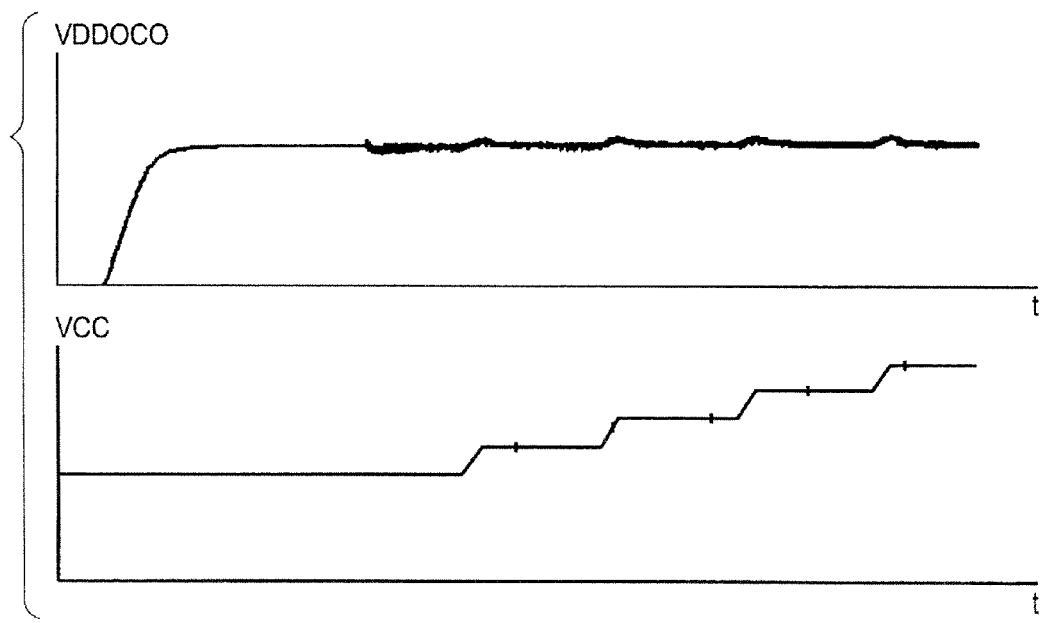
FIG. 7 is a graph for illustrating a difference between VCC and VDDOCO.

FIG. 7 is a graph for illustrating that the amplifier 58 stably outputs the voltage VDDOCO.

As shown in FIG. 7, the external power supply voltage VCC varies with time t. Although the amplifier 58 operates on the external power supply voltage VCC, a feedback path in the amplifier 58 serves to stabilize the voltage VDDOCO which is output from the amplifier 58.

[Operation for Compensating Variation in Oscillation Frequency]

Figure 8:
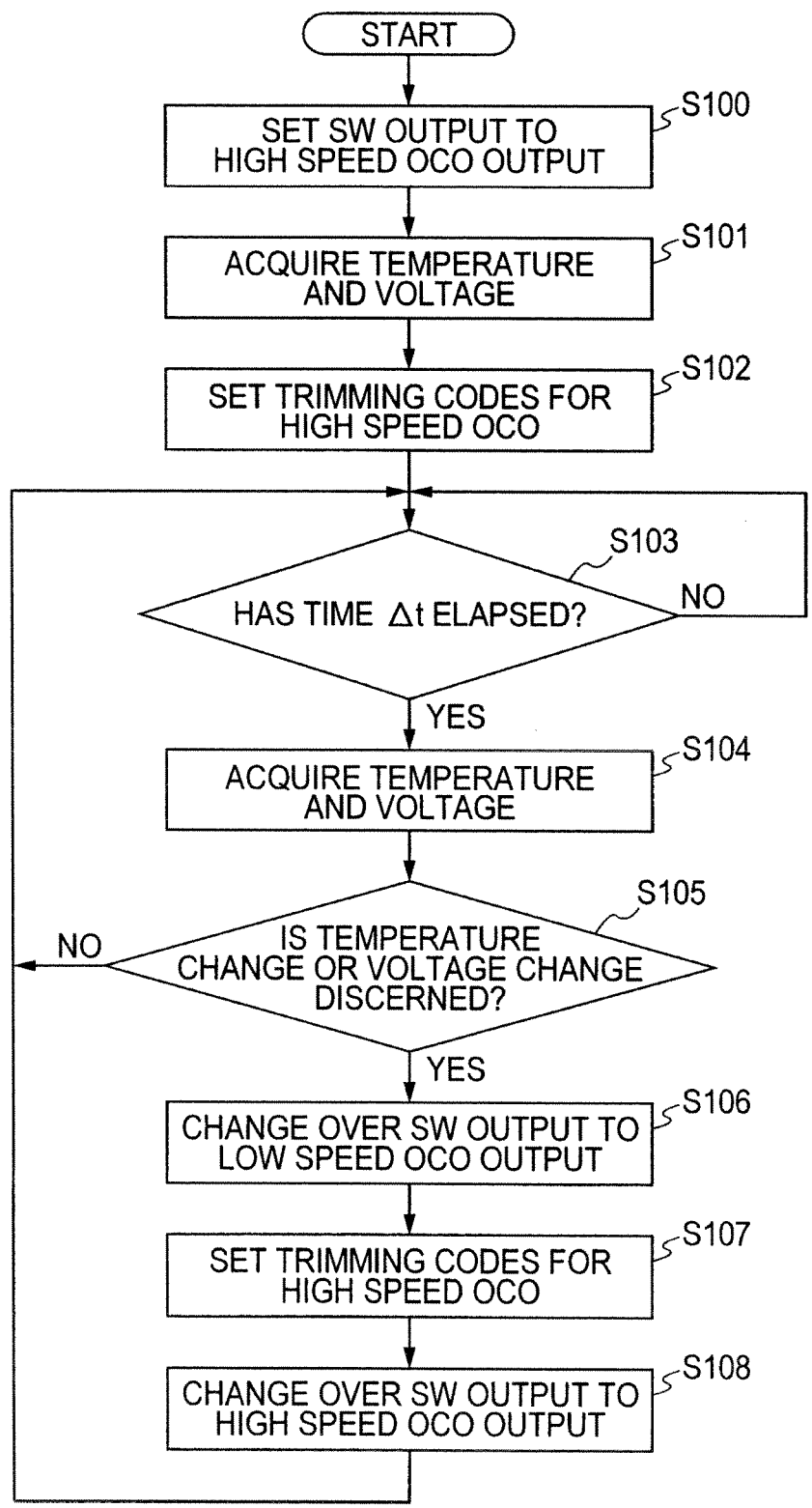
FIG. 8 is a flowchart elucidating an operation for compensating a variation in the oscillation frequency for the microcomputer of an embodiment of the present invention.

FIG. 8 is a flowchart elucidating an operation for compensating a variation in the oscillation frequency.

Referring to FIG. 8, the logic unit 13 sets the switch SW output to the high speed clock H_CLK which is the output of the high speed OCO 10 (step S100).

The logic unit 13 acquires a temperature code which is output from the temperature sensor 5 and a voltage code which is output from the voltage sensor 4 (step S101).

Then, the logic unit 13 reads trimming codes TRIMCODE1 [2:0], TRIMCODE2 [4:0], and TRIMCODE3 [7:0], related to the acquired temperature code and voltage code from the trimming table in the flash memory 8. The logic unit 13 outputs control signals representing the values of the trimming codes TRIMCODE1[2:0], TRIMCODE2 [4:0], and TRIMCODE3 [7:0] to the power supply module 12. According to the control signals, the power supply module 12 adjusts the values of the reference voltage VREFC and the reference current Iconst. The high speed OCO 10 operates on the adjusted reference voltage VREFC and reference current Iconst (step S102).

Then, after a predetermined time Δt has elapsed (YES in step S103), the logic unit 13 acquires again a temperature code which is output from the temperature sensor 5 and a voltage code which is output from the voltage sensor 4 (step S104).

When the logic unit 13 discerns a change in the acquired temperature code from the previously acquired temperature code or a change in the acquired voltage code from the previously acquired voltage code (YES in step S105), the logic unit 13 changes over the switch SW output from the high speed clock H_CLK which is the output of the high speed OCO 10 to the low speed clock S_CLK which is output of the low speed OCO 6 (step S106).

Then, the logic unit 13 reads trimming codes TRIMCODE1 [2:0], TRIMCODE2 [4:0], and TRIMCODE3 [7:0], related to the acquired temperature code and voltage code from the trimming table in the flash memory 8. The logic unit 13 outputs control signals representing the values of the trimming codes TRIMCODE1[2:0], TRIMCODE2 [4:0], and TRIMCODE3 [7:0] to the power supply module 12. According to the control signals, the power supply module 12 adjusts the reference voltage VREFC and the reference current Iconst. The high speed OCO 10 operates on the adjusted reference voltage VREFC and reference current Iconst (step S107).

Then, the logic unit 13 changes over the switch SW output from the low speed clock S_CLK which is the output of the low speed OCO 6 to the high speed clock H_CLK which is the output of the high speed OCO 10 (step S108).

[Operation when Trimming Codes are Changed]

Figure 9:
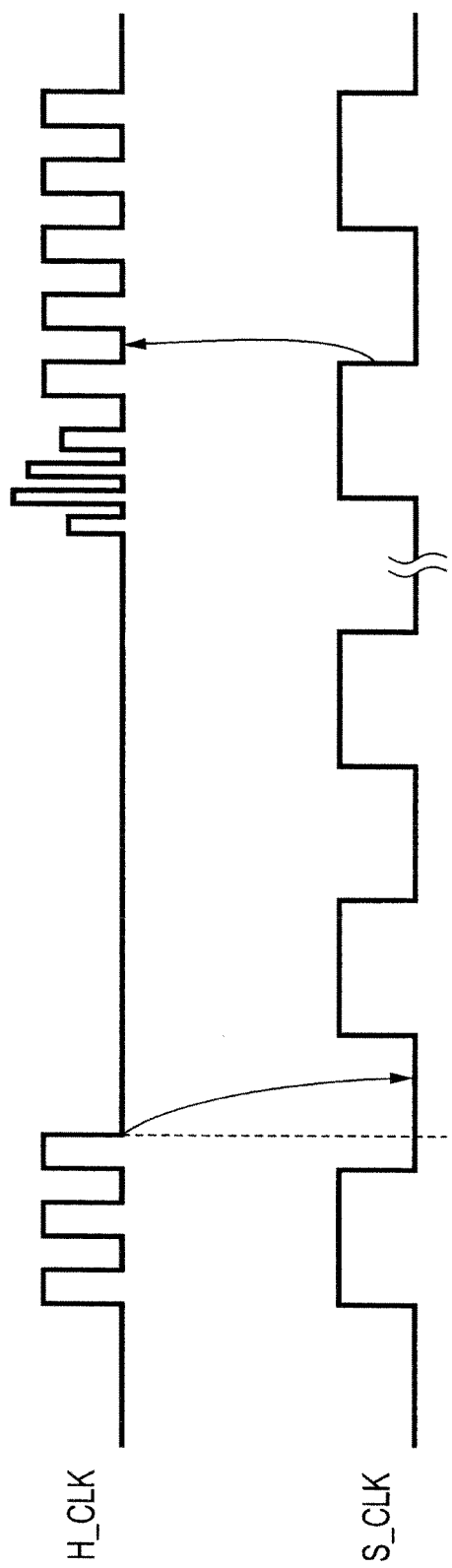
FIG. 9 is a diagram showing an example of a sequence when trimming codes are changed.

FIG. 9 is a diagram showing an example of a sequence when trimming codes are changed.

Referring to FIG. 9, the switch SW during normal operation is set to output the high speed clock H_CLK which is output by the high speed OCO 10. When trimming codes are changed, the switch SW is changed over to output the low speed clock S_CLK which is output by the low speed OCO 6. In the meantime, the high speed OCO 10 becomes to operate on the reference current Iconst and reference voltage VREFC adjusted by new trimming codes. After a predetermined time has elapsed until the high speed clock H_CLK which is output by the high speed OCO 10 has stabilized, the switch SW is changed over to output the high speed clock H_CLK which is output by the high speed OCO 10.

In this way, during an adjustment of the reference current Iconst and the reference voltage VREFC, the switch SW is set to supply the low speed clock S_CLK which is output by the low speed OCO 6 to the logic unit 13 and the communication interface 11. Thus, it is possible to prevent a hazard occurring or a corrupted duty ratio in the clock signal supplied to the logic unit 13 and the communication interface 11.

[High Speed OCO Operating Voltage]

Figure 10:
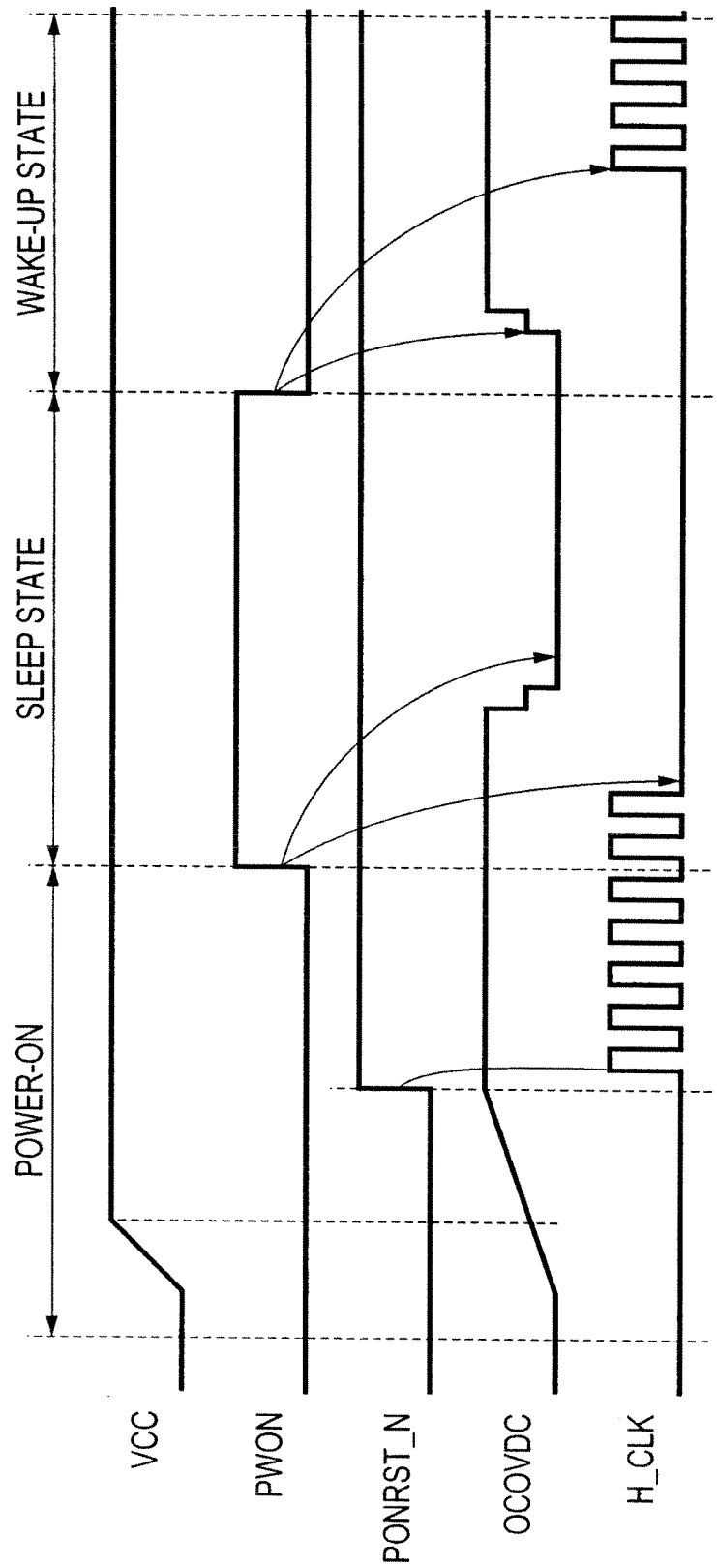
FIG. 10 is a diagram showing an example of a sequence of power-on, sleep, and wake-up.

FIG. 10 is a diagram showing an example of a sequence of power-on, sleep, and wake-up.

Referring to FIG. 10, the power supply module 12, when the external power supply voltage VCC rises, increases the voltage VDDOCO for operating the high speed OCO 10 to turn on the high speed OCO 10. This is because it is needed to generate the high speed clock H_CLK so that the logic unit 13 can perform a self-diagnosis when the microcomputer is booted.

Then, the power-on reset unit 2 detects the increase of the voltage VDDOCO for operating the high speed OCO 10 and activates a power-on reset signal PONRST_N to "H" level. When the power-on reset signal PONRST_N is activated to "H" level, the high speed OCO 10 starts to generate the high speed clock H_CLK.

When the microcomputer enters a sleep state, a power down signal PWDN is turned to "H" level. When the power down signal PWDN is turned to "H" level, first, the high speed OCO 10 stops generating the high speed clock H_CLK. Then, the power supply module 12 causes the voltage VDDOCO for operating the high speed OCO 10 to drop down. It is thus possible to prevent an unstable high speed clock H_CLK from being generated despite a fall in the voltage VDDOCO for operating the high speed OCO.

When the microcomputer enters a wake-up state, the power down signal PWDN is turned to "L" level. When the power down signal PWDN is turned to "L" level, first, the power supply module 12 causes the voltage VDDOCO for operating the high speed OCO 10 to rise. Then, the high speed OCO 10 resumes generating the high speed clock H_CLK. It is thus possible to prevent an unstable high speed clock H_CLK from being generated despite no rise in the voltage VDDOCO for operating the high speed OCO 10.

As described above, according to the described embodiment of the present invention, the ambient temperature of the high speed OCO and the high speed OCO operating voltage are detected and the reference current and reference voltage to be supplied to the high speed OCO are adjusted, based on the detected temperature and voltage. Therefore, it is possible to prevent the oscillation frequency from varying with a change in the ambient temperature and/or a change in the external power supply voltage. Further, the reference current and reference voltage which are supplied to the high speed OCO, the power supply voltage VDD for operating the logic unit, and the power supply voltage VDDOCO for operating the high speed OCO are generated through the use of a common primary reference voltage that is generated by the BGR. Therefore, a circuit sharing design can be implemented and the circuit area of the power supply module can be reduced.

Modification Examples

The present invention is not limited to the above-described embodiment and includes modifications as exemplified below.

(1) Trimming Codes. In the described embodiment of the present invention, the trimming codes are set to values intended to maintain a constant reference current and a constant reference voltage to be supplied to the high speed OCO 10, thus to maintain a constant oscillation frequency of the high speed clock H_CLK, even if temperature changes and/or the external power supply voltage changes. However, setting the trimming codes is not sp restricted. The values of the trimming codes may be set so that the oscillation frequency of the high speed clock H_CLK will be optimum as a function of temperature and/or the external power supply voltage, instead of keeping the oscillation frequency constant.

(2) High Speed Clock H_CLK. Although the high speed clock H_CLK is supplied to the logic unit and the communication interface in the described embodiment of the present invention, the high speed clock H_CLK may be supplied to other components within the microcomputer. For instance, the high speed clock H_CLK may be supplied to a peripheral bus.

The embodiment disclosed herein is to be considered in all respects as illustrative and not restrictive. The scope of the present invention is indicated by the appended claims, rather than by the foregoing description, and all changes which come within the meaning and range of equivalency of the claims are therefore intended to be embraced therein.

What is claimed is:

1. A microcontroller, comprising:
    a first oscillator that generates a first clock having a first frequency based on a reference voltage;
    a temperature sensor that senses a temperature to generate a sensed temperature value; and
    a voltage sensor that senses a voltage to generate a sensed voltage value, wherein
    the reference voltage is adjusted by both the sensed temperature value and the sensed voltage value to adjust the first frequency, and
    the microcontroller further comprises:
        a second oscillator that generates a second clock having a second frequency lower than the first frequency; and
        an internal circuit that receives the first clock, wherein the second clock is supplied to the internal circuit during the first frequency of the first clock is under adjustment.

2. The microcontroller according to claim 1, further comprising:
    a storage unit that stores a trimming codes,
    wherein one of the trimming codes is selected by both the sensed temperature value and the sensed voltage value, and
    wherein the reference voltage is adjusted by the selected trimming code to adjust the first frequency.

3. The microcontroller according to claim 1, wherein the storage unit includes a non-volatile memory.

4. The microcontroller according to claim 1, wherein the first oscillator includes a voltage controlled oscillator (VCO) to adjust the first frequency based on the reference voltage.

5. The microcontroller according to claim 4, wherein the first oscillator generates the first clock based on the reference voltage and a reference current,
    wherein each of the reference voltage and the reference current is adjusted by both the sensed temperature value and the sensed voltage value, and
    wherein the VCO adjusts the first frequency based on the reference voltage and the reference current.

6. The microcontroller according to claim 1, wherein the microcontroller is a single chip microcontroller.

7. The microcontroller according to claim 1, wherein the internal circuit is a central processing unit (CPU).

8. The microcontroller according to claim 1, wherein the internal circuit is a communication interface.

9. The microcontroller according to claim 1, wherein the voltage sensor senses an operating voltage of the microcontroller.

* * * * *